United States Patent [19]

Stumpf et al.

[11] Patent Number: 4,946,524
[45] Date of Patent: Aug. 7, 1990

[54] APPLICATOR AND METHOD FOR APPLYING DRY FILM SOLDER MASK ON A BOARD

[75] Inventors: Robert C. Stumpf, Orange; Jose L. Correa, Fullerton; Charles L. Farnum, Riverside, all of Calif.

[73] Assignee: Morton International, Inc., Chicago, Ill.

[21] Appl. No.: 318,023

[22] Filed: Mar. 2, 1989

[51] Int. Cl.$^5$ ............................................. B32B 31/20
[52] U.S. Cl. .................................... 156/87; 156/286; 156/290; 156/358; 156/553
[58] Field of Search ..................... 156/555, 522, 308.4, 156/302, 80, 64, 290, 351, 358, 366, 361, 553, 552, 286, 87, 312

[56] References Cited

U.S. PATENT DOCUMENTS

| | | | |
|---|---|---|---|
| 3,658,629 | 4/1972 | Cramer et al. | 156/555 |
| 4,387,000 | 6/1983 | Tancredi | 156/555 |
| 4,495,014 | 1/1985 | Gebrian et al. | 156/80 |
| 4,650,536 | 3/1987 | Ceraso | 156/555 |

Primary Examiner—Michael W. Ball
Assistant Examiner—Chester T. Barry
Attorney, Agent, or Firm—Gerald K. White

[57] ABSTRACT

In the application of dry film solder mask material to a board, a process and applicator for the implementation thereof features automatic feed of the board, initiation of leading and trailing edge tacking, by heated or unheated tacking rolls, of the film to the board by utilization of the board to apply a force tangential to the tacking rolls, and logic circuitry to regulate the leading and trailing edge tacking by closing the tacking rolls to apply roll pressure during each of the leading and trailing edge tacks, and after tacking of the film to the leading edge of the board, opening of the rolls to allow the film to be applied without pressure, with the rolls being closed again to tack the film to the trailing edge of the board.

19 Claims, 7 Drawing Sheets

APPLICATOR AND METHOD FOR APPLYING DRY FILM SOLDER MASK ON A BOARD

BACKGROUND OF THE INVENTION

1. Field of the Invention

The present invention relates to a process and apparatus for applying dry film solder mask material to the surface of a printed circuit board.

2. Description of the Prior Art

A solder mask is a hard, permanent layer of electrically non-conductive material which covers the surface of a printed circuit board and encapsulates the traces of the printed circuit. The solder mask is patterned to fully cover the circuitry except for portions that are intentionally left exposed for the soldering thereto of other components.

Solder masks, typically, are formed from a layer of photoimageable composition which is applied to a surface of the printed circuit board. The photoimageable layer is exposed to an actinic radiation pattern as determined by a template or artwork. Subsequent to exposure, the photoimageable layer is developed in an organic solvent or an aqueous solution which washes away either exposed or unexposed portions of the layer, depending upon whether the photoimageable layer is positive or negative acting. The portion of the layer remaining on the surface is then cured, as with heat and/or ultra violet radiation, to form a hard, permanent solder mask.

One method for applying a layer of photoimageable composition to the surface of the circuit board is to apply the composition in liquid form. After drying or partially curing, the liquid composition forms a semi-stable layer.

There are a number of advantages to applying a photoimageable layer to a circuit board in the form of a dry film rather than in liquid form. Dry films that are free of organic solvents are commercially available. The use of dry film eliminates organic solvent hazards from the work place and the need, also, for apparatus to protect the immediate work environment and the general environment from organic solvent emissions.

Typically, a dry film comprises a cover sheet of support material that is somewhat flexible but which has sufficient rigidity to provide structural support for a layer of a photoimageable composition which overlies one surface of the support sheet. The cover sheet may be formed of a polyester material such as polyethylene terephthalate (PET), such as that sold as MELINEX ®.

For the protection of the photoimageable layer and to enable the dry film to be rolled, it is conventional to cover the exposed surface of the photoimageable layer with a removable protective sheet of polyethylene. An example of such a dry film is sold as LAMINAR DM ® by the Dynachem Division of Morton Thiokol, Inc., the assignee of the present invention.

It is the practice in the prior art to remove the protective polyethylene sheet from the photoimageable composition immediately prior to application of the dry film to the surface of the printed circuit board. Specifically, an automated apparatus peels away and rolls up the protective sheet as the dry film is unrolled from a reel. The dry film is applied to the surface of the printed circuit board with the photoimageable layer in direct contact with the board surface. Using heat and vacuum, the photoimageable layer is immediately laminated to the surface of the board. The polyester cover sheet remains overlying the photoimageable layer, protecting the photoimageable layer from exposure to oxygen and from damage tending to be caused as the result of handling.

The dry film is exposed to patterned actinic radiation through the PET cover sheet. The polyester cover sheet is then removed, permitting access to the photoimageable layer by developer. Depending upon the composition of the photoimageable layer, the photoimageable layer is developed with organic solvent, aqueous developer, or semi-aqueous developer, that is, a developer including both water and organic solvent. Most photoimageable composition layers require some cure subsequent to development to cause the layer to become hard and permanent and useful for serving as a solder mask. Curing may be effected with heat and/or ultra violet radiation depending upon the composition of the photoimageable layer.

Because the polyester cover sheet is relatively rigid, the photoimageable layer cannot fully conform to the irregular contours of the printed circuit board, from the flat surface of which circuitry traces project outward. As a result, the thickness of the photoimageable layer, when laminated to the board, must be slightly greater than the projection of the traces outward of the surface of the board for the photoimageable composition to overlie the outer surfaces of the traces. Thus, outer regions of photomask exist between the portions of the circuitry from which the photoimageable composition is removed during the development of the solder mask and to which a component is to be soldered. Such outer regions pose a problem particularly with respect to components which are to be surface-mounted to the printed circuit board.

Some circuit traces are narrower at the foot thereof than at the top. In such cases, small overhangs of the photoimaging layer tend to extend outwardly along each side of each trace (an effect known as "mushrooming"). With both liquid compositions and conventional dry films, air-filled voids tend to remain below such overhangs. The air trapped in such voids may produce some oxidation of the circuit traces and may lead to eventual defects in the solder mask.

An improved dry film and a process for the use thereof in the formation of a solder mask on the surface of a printed circuit board in order to eliminate the foregoing problems of both liquid and conventional dry films are disclosed and claimed in application for U.S. Pat. 4,889,790 issued Dec. 26, 1989, to Leo Roos, Frederick J. Axon and James J. Briguglio, assigned to the assignee of the present invention and the disclosure of which is incorporated herein by reference. The improved dry film includes a cover sheet formed of flexible but generally non-conforming polyester material such as polyethylene terephthalate which gives the dry film shape while allowing it to be rolled up onto a reel. On one surface of the cover sheet there is a thin layer of material, which is referred to as a top coat, and preferably, is soluble in the developer for the photoimageable material. The photoimageable composition forms a layer over the other surface of the top coat. A removable sheet of polyethylene protects the photoimageable composition layer. The material of the top coat is selected for transparency, strength and flexibility, and is further characterized in being more adherent to the photoimageable composition layer than to the cover sheet.

In the formation of a solder mask, as disclosed in the Roos et al. application, the protective, removable sheet of polyethylene is peeled away, and the exposed surface of the photoimageable composition layer is tacked to a minor portion of the surface of the printed circuit board. The polyester cover sheet is removed, leaving the top coat as a protective covering on the layer of photoimageable composition. The layer of photoimageable composition at this time is firmly laminated to the surface of the board with the use of heat and vacuum in order to conform the photoimageable composition layer to the contours of the surface of the board.

In the application of the dry film solder mask material, it is necessary to cover the printed circuit board with a loose sheet of film before vacuum lamination. The film sheet must allow the draw-off of the air enclosed between it and the surface of the circuit board before applying mechanical pressure to conform the film to the board surface. The film outer surface is protected, during application, by the top coat. The polyester cover sheet may be removed prior to the vacuum application process to allow for good conformation of the film to the board.

SUMMARY OF THE INVENTION

An object of the invention is to provide a process and apparatus for applying the dry film to the surface of a printed circuit board allowing, at the same time, the handling of the board with the applied film, the removal of the polyester cover sheet, and the draw-off of the air enclosed between the film and the board.

Another object of the invention is to provide an applicator for covering the surface of each of a plurality of printed circuit boards with a loose sheet of dry film by tacking the film to leading and trailing edge areas of the surface of each of the boards as the boards are moved in succession through the applicator, the tacking being accomplished by means of heated tacking rolls that are closed to force a first region of the film into pressure contact with the surface of the board at a leading edge thereof, with the tacking rolls then being opened and subsequently closed again to force a second region of the film that is separated from the first region thereof into pressure contact with the surface of the board at a trailing edge thereof whereby the film is applied to the board as an integral whole, the dimension of the portion of the film between the first and second regions being substantially the same as that between the leading and trailing edge surfaces of the board, said portion of the film being applied to the surface of the board without the utilization of heat or pressure.

A further object of the invention is to provide such an applicator wherein the tacking rolls are relatively movable from a normally closed position to an open position and tacking at the leading edge of each board surface is initiated by forcibly feeding the leading edge of each of the boards into tangential contact with the tacking rolls.

In accomplishing these and other objectives of the invention, there is provided a process and applicator key features of which include automatic feed of the circuit board by means of feed rollers, the leading edge tacking of the film by applying a force tangential to the tacking rolls, the logic used to regulate the leading and trailing edge tacking, the application of roll pressure during the leading and trailing edge tack, and a regulation system to apply tacking pressure to a leading and trailing edge of the board. In particular, after tacking the film to the leading edge of the board, the rolls open again to allow the film to be loosely applied without pressure. The rolls close again to tack the trailing edge.

The dry film has high flow characteristics in the temperature range of 30° C. to 100° C. It is preferred to accomplish the tacking within this temperature range because, in this range, it is easier to tack the film to the surface of the board.

By the term "leading edge surface" of the board or panel, as is used hereinafter, is meant the edge of the surface of the board to which it is desired to make the initial tack of the dry film solder mask to the board. Similarly, by the term "trailing edge surface" of the board is meant the edge of the surface of the board to which it is desired to have the dry film solder mask continue and at which the second tack is made.

The various features of novelty which characterize the invention are pointed out with particularity in the claims annexed to and forming a part of the specification. For a better understanding of the invention, its operating advantages and specific objects attained by its use, reference is made to the accompanying drawings and descriptive matter in which a preferred embodiment of the invention is illustrated.

BRIEF DESCRIPTION OF THE DRAWINGS

With this description of the invention, a detailed description follows with reference being made to the accompanying drawings which form part of the specification, and of which.

DESCRIPTION OF THE PREFERRED EMBODIMENT

The drawings illustrate an applicator 10, according to the invention, for covering a printed circuit board with a loose sheet of dry film. The applicator 10 incorporates features taken from the Model 360 DFSM Manual Pre-Laminator and the Model 360 Laminator/Cleaner which are manufactured and sold by the Dynachem Division of Morton Thiokol, Inc. More specifically, the applicator 10 comprises a modification of the Model 360 DFSM with the heating and pneumatic systems from the Model 360 Laminator Cleaner, and in addition involves reconfiguration of electrical controls and circuitry for effecting tacking of a photoimageable film to leading and trailing edge surfaces of printed circuit boards in a regulated manner.

Figure 1:
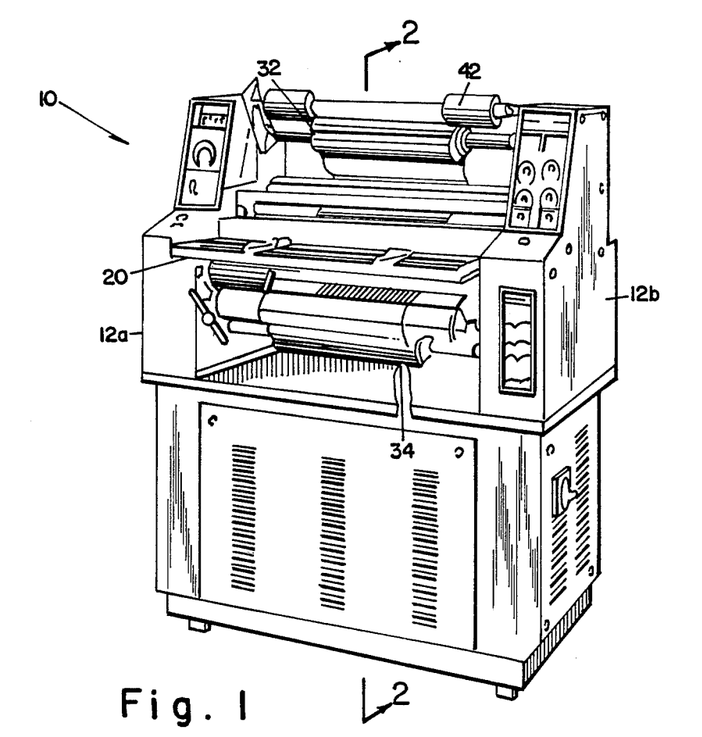
FIG. 1 is a perspective view of the applicator according to the invention, as seen from the front or entrance, that is, introduction, end thereof.
Figure 2:
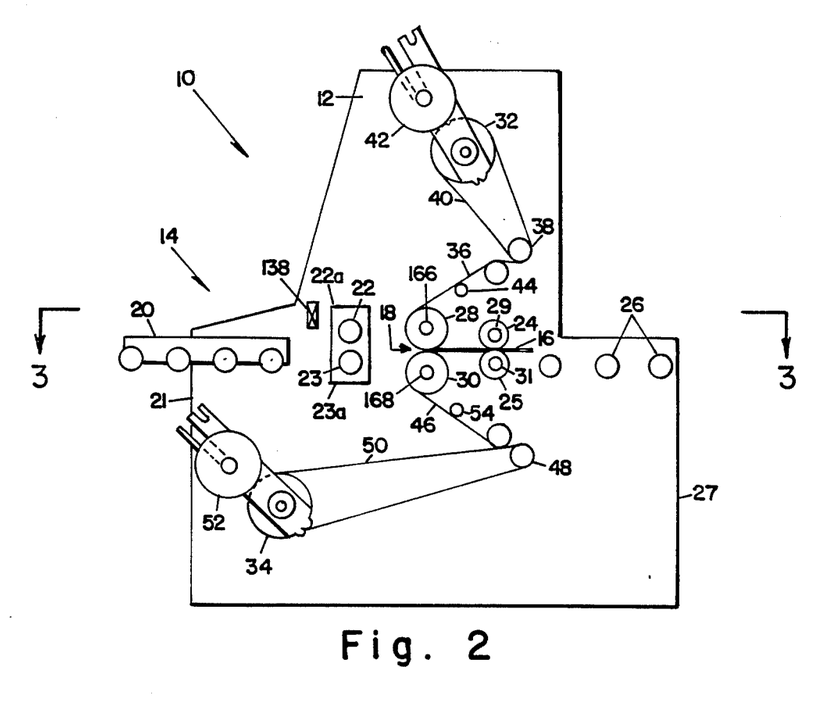
FIG. 2 is a schematic view, as seen by a section with a plane containing the lines 2—2 of FIG. 1, showing the tacking rolls, the printed circuit board feed rolls, and the photoimageable thread up arrangement of the applicator.
Figure 3:
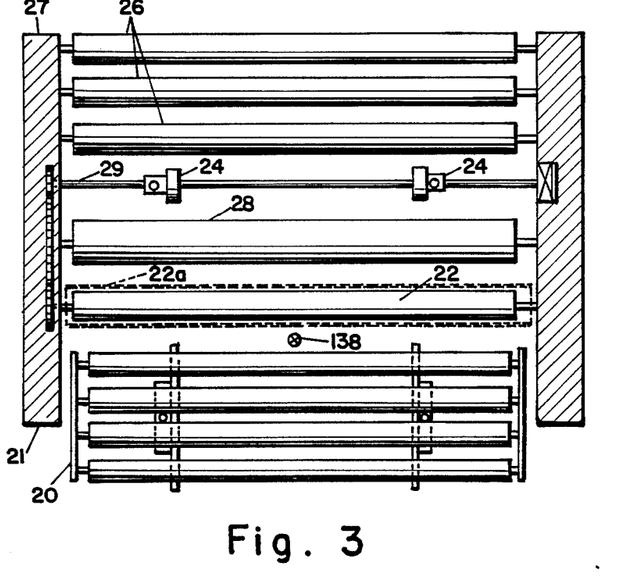
FIG. 3 is a schematic view comprising a section taken along lines 3—3 of FIG. 2.

Thus, as shown in FIGS. 1-3, the applicator 10 comprises a main body 12 and a driven conveyor means 14, for transferring printed circuit boards or panels 16 one-by-one towards and through input feed or pinch rolls 22 and 23 to a tacking region 18 and then on through the main body 12. The conveyor means 14 includes a feed table roller means 20 positioned on the front or entrance side designated 21 of the main body 12, the feed rolls 22 and 23, rear or output drive wheels 24 and 25, and an exit table roller means 26 on the rear or exit side designated 27. The input feed rolls 22 and 23 desirably are provided with covers 22a and 23a, respectively, as shown. The output drive wheels 24 and 25 are driven by output drive shafts 29 and 31, respectively. Since a solder mask is normally formed on both sides of a printed circuit board, the applicator 10 is built symmetrically with respect to the plane of conveyance of the circuit boards 16 by the conveyor means 14, as best seen in FIG. 2. Side cover panels 12a and 12b are provided for enclosing the left and right sides, respectively, of the applicator 10.

In accordance with the invention, a layer of dry film, which preferably is of the type disclosed and claimed in the aforementioned Roos et al. U.S. Patent, is attached to each of the upper and lower surfaces of the printed circuit board 16 then passing through the tacking region 18, through the action of parallel upper and lower tacking rolls 28 and 30, for convenience sometimes referred to hereinafter as first and second tacking rolls, respectively.

The first or upper roll 28 is movable toward and away from the second or lower roll 30 with the peripheral surfaces thereof being normally positioned closely adjacent to each other, with the ends of upper and lower dry films 36 and 46, as shown in FIG. 2, being captured therebetween. Upon entry of a circuit board 16 into the tacking region 18, being driven by the input feed rolls 22 and 23, the leading edge of the board 16 applies a force tangential to the tacking rolls 28 and 30. This tangential force is induced by the traction of the board 16 produced by the feed rolls 22 and 23 and produces a component of force at a right angle thereto that forcibly separates the rolls 28 and 30. The resulting upward movement of the movable upper roll 28 allows the board 16 to be moved between the tacking rolls 28 and 30.

Figure 4:
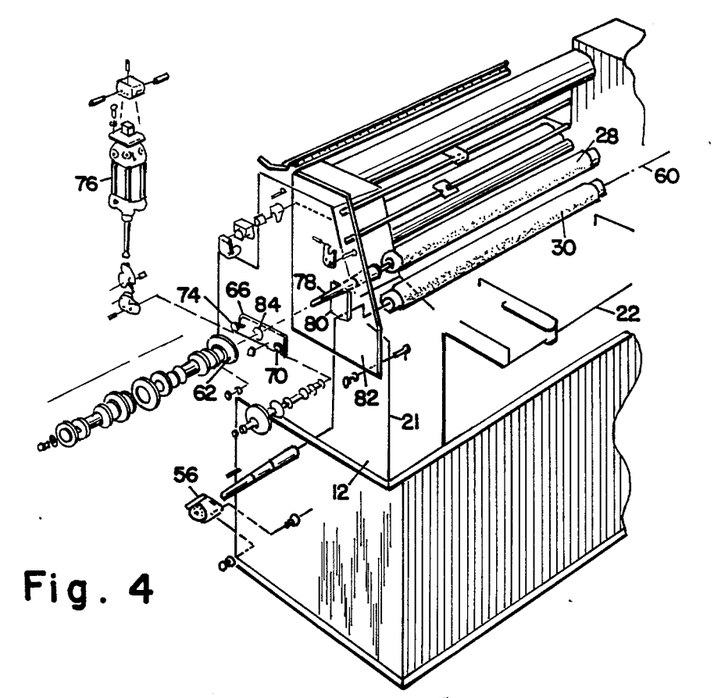
FIG. 4 is a partial fragmented perspective view of the left side of the applicator of FIG. 1 showing the tacking rolls and a left tacking roll actuating sliding plate for the upper roll.
Figure 5:
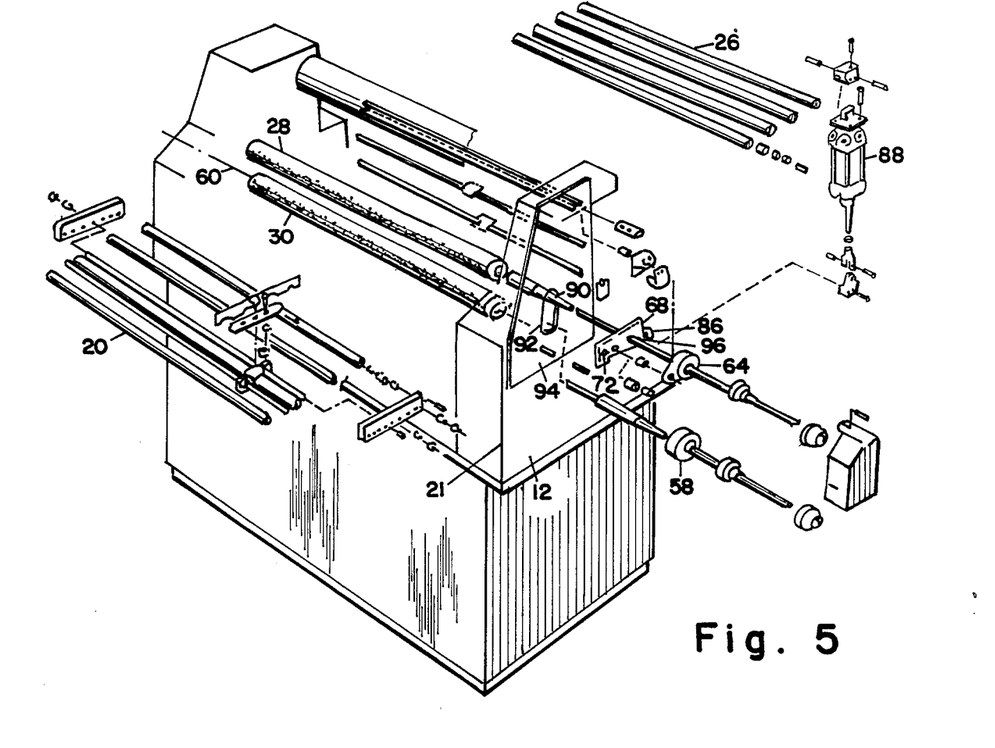
FIG. 5 is a partial fragmented perspective view of the right side of the apparatus of FIG. 1 showing the tacking rolls and a right tacking roll actuating sliding plate for the upper roll.

The initial upward movement of the tacking roll 28 actuates a first sensing means, specifically a sensing switch 116, that is illustrated and described in connection with FIGS. 6 and 7. Actuation of sensing switch 116 initiates a tacking sequence of operations of an electrical and pneumatic system that includes pneumatic cylinders 76 and 88, as shown in FIGS. 4 and 5, for applying downward tacking pressure to the tacking roll 28. No air is supplied to the lower chambers of the pneumatic cylinders 76 and 88 to cause upward movement of the tacking roll 28 until a timer 118, as described in connection with FIG. 10, times out. This is after completion of the leading edge tack.

Upon the actuation of switch 116 and the timer 118, downward pressure is applied by the pneumatic cylinders 76 and 88 to the upper tacking roll 28 to tack the leading end of the dry films 36 and 46 against each of the upper and lower surfaces of board 16, at the leading edge surfaces thereof or closely adjacent thereto.

To ensure a firm tacking attachment, the rolls 28 and 30 preferably are heated and suitable downward pressure is applied on roll 28 for a predetermined period, as determined by timer 118, as the board 16 is conveyed through the applicator 10. The downward pressure on the upper roll 28 is then removed and air is supplied to the lower chambers of pneumatic cylinders 76 and 88. This causes the upper roll 28 to rise above the board 16. The board 16 continues to be conveyed through the applicator 10 with each of the dry films 36 and 46 being drawn, without the application of heat or pressure over the associated surface thereof. During such time, traction between the dry films 36 and 46 and the respectively associated tacking rolls 28 and 30 cause the latter to rotate.

Tacking of the dry films 36 and 46 to the trailing edge surfaces of the board 16 is initiated by a second sensing means, specifically, a switch 138. Switch 138 may comprise a proximity switch, a photoelectric or other device suitable for detecting the trailing edge of the board 16, as indicated in FIG. 2. After the switch 138 detects the trailing edge of the board 16, a timer 122, as described in connection with FIG. 10 and which determines the trailing edge surface tack, placement and size, is actuated, and begins its timing sequence.

As a result, upon entry of the trailing edge surfaces of the board 16 into the tacking region 18, downward pressure again is applied by the pneumatic cylinders 76 and 88 to the upper roll 28 to tack the dry films 36 and 46 to the upper and lower trailing edge surfaces, respectively, of the board 16. The board is conveyed through and beyond the region of the tacking rolls 28 and 30 by the rear or output drive wheels 24 and 25.

Thus, dry films are attached to each of the surfaces of the board, being loosely applied in each case, and fixedly attached by tacking to the board only at the leading and trailing edges, across the full width of the film, with the output wheels being applied at the side edges of the upper and lower surfaces of the board that are not covered by the film. The film width must be less than the panel width to allow the traction of the output drive wheels over the surface of the panel.

It is contemplated that if desired, a succession of boards 16 to be laminated on both sides may be fed to the applicator 10 with a dry film 36 and 46, respectively, being tacked to the leading and trailing edges of each of the upper and lower surfaces thereof. In such an embodiment of the invention, a succession of boards 16 would exit the applicator 10 connected to each other by the dry films 36 and 46 but in spaced arrangement. Cutting of the dry films 36 and 46 for effecting separation of the boards 16 may be manual.

Alternatively, while not shown, it will be understood that suitable film cutting means, as known in the prior art, may be employed for cutting the films, as disclosed, for example, in U.S. Pat. Nos. 4,025,380 to E. T. Bernardo and 4,650,536 to A. B. Ceraso to match the length of each board 16 to be covered, thereby to enable a trailing end of each of the upper and lower films 36 and 46 to be tacked to the trailing edge surface of the board, with, if desired, a minor portion only of the surface of the board being covered by the films.

As shown in FIG. 2, the applicator 10 includes an upper dry film supply roll 32 and a lower dry film supply roll 34. Dry film 36 is unwound from the upper dry film supply roll 32 and is drawn downwardly past a stripping roll 38. At the stripping roll 38, a polyethylene cover sheet 40 is separated from the dry film 36 and is directed upwardly to be wound on an upper take-up reel 42. The dry film 36 continues in a downward path past an antistatic bar 44 and is wrapped counterclockwise, as seen in the drawing, around the upper tacking roll 28.

Similarly, dry film 46 is unwound from the lower dry film supply roll 34 and is drawn upward past a lower stripping roll 48. At the stripping roll 48, a polyethylene cover sheet 50 is separated from the dry film 46 and is directed to a lower take-up reel 52 to be wound up thereon. The dry film 46 continues in an upward path past an antistatic bar 54 and is wrapped clockwise around the lower tacking roll 30.

Rolls 28 and 30, as shown in FIGS. 4 and 5, are mounted for rotation in a "free-wheeling" manner. That is to say, they are mounted for rotation in suitable bearings, but are rotated only in response to the boards 16 and the films 36 and 46 being conveyed through the apparatus 10 by the input feed rolls 22 and 23 and output drive wheels 24 and 25. Specifically, the lower roll 30 is mounted for rotation on fixed bearings 56 and 58, and thus rotates on a fixed axis indicated at 60. The upper roll 28, on the other hand, is mounted for rotation on vertically movable bearings 62 and 64 which allow the upper roll 28 to be moved toward and away from the lower roll 30 for enabling tacking the dry films 36 and 46 to the opposite sides of the printed circuit boards.

The bearings 62 and 64 are mounted for vertical movement on respectively associated elongated sliding plates 66 and 68, with the plate 66 being positioned at the left end of roll 28 and the plate 68 at the right end thereof. Each of the sliding plates 66 and 68 is pivoted for angular movement at one end, that end which is closest to the entrance side 21 of the body 12 of applicator 10. Thus, the sliding plate 66 is pivoted on a fixed pivot 70 and sliding plate 68 is pivoted on a fixed pivot 72. Pivot 70 is attached to a left side plate 82 of main body 12 of applicator 10. Similarly, pivot 72 is attached to a right side plate 94 of the main body 12. The other end of sliding plate 66 is attached by a tab 74 thereon to the upwardly positioned pneumatic cylinder 76. A shaft 78 forming an extension of roll 28, at the left end thereof, extends through a hole 80 in the left side plate 82. Shaft 78 fits thru a hole 84 in sliding plate 66. Hole 84 is positioned in alignment with the fixed pivot 70 and tab 74. In order to allow a range of vertical movement of shaft 78 and thereby of roll 28, hole 80 in plate 82 is elongated in the vertical direction, as shown.

Similarly, the other end of sliding plate 68 is attached by a suitable means thereon to the upwardly positioned pneumatic cylinder 88. A shaft 90 forming an extension of roll 28, at the right side thereof, extends through a hole 92 in the right side plate 94 and fits thru a hole 96 in sliding plate 68. Hole 96 is positioned in alignment with the fixed pivot 72 and pin 86. Hole 92 in side plate 94 is elongated in the vertical direction to allow a range of vertical movement of shaft 90 and thereby of roll 28.

Figure 10:
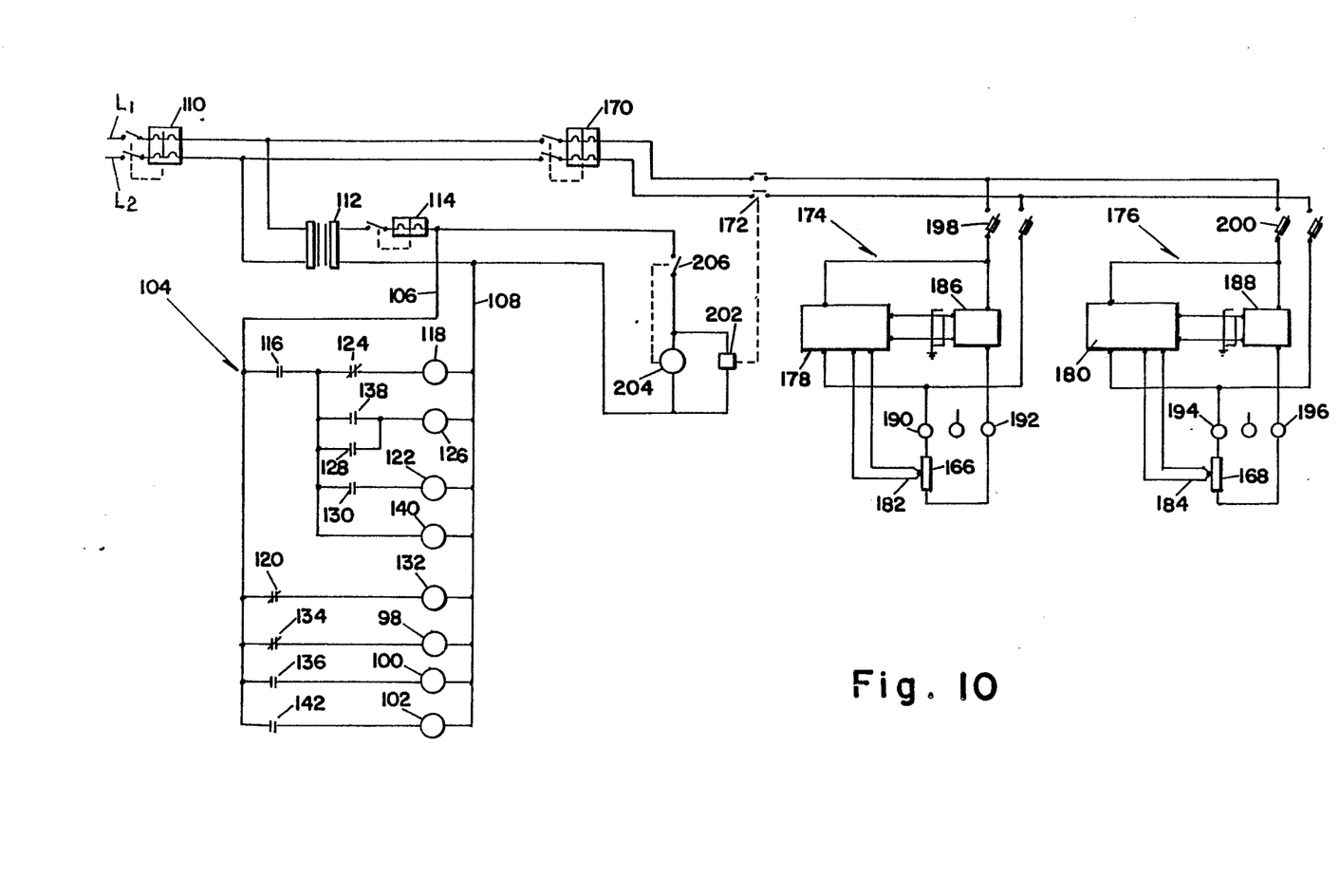
FIG. 10 is a wiring diagram showing the electrical circuitry provided in the applicator for controlling the tacking of the photoimageable dry film to the printed circuit boards.
Figure 11:
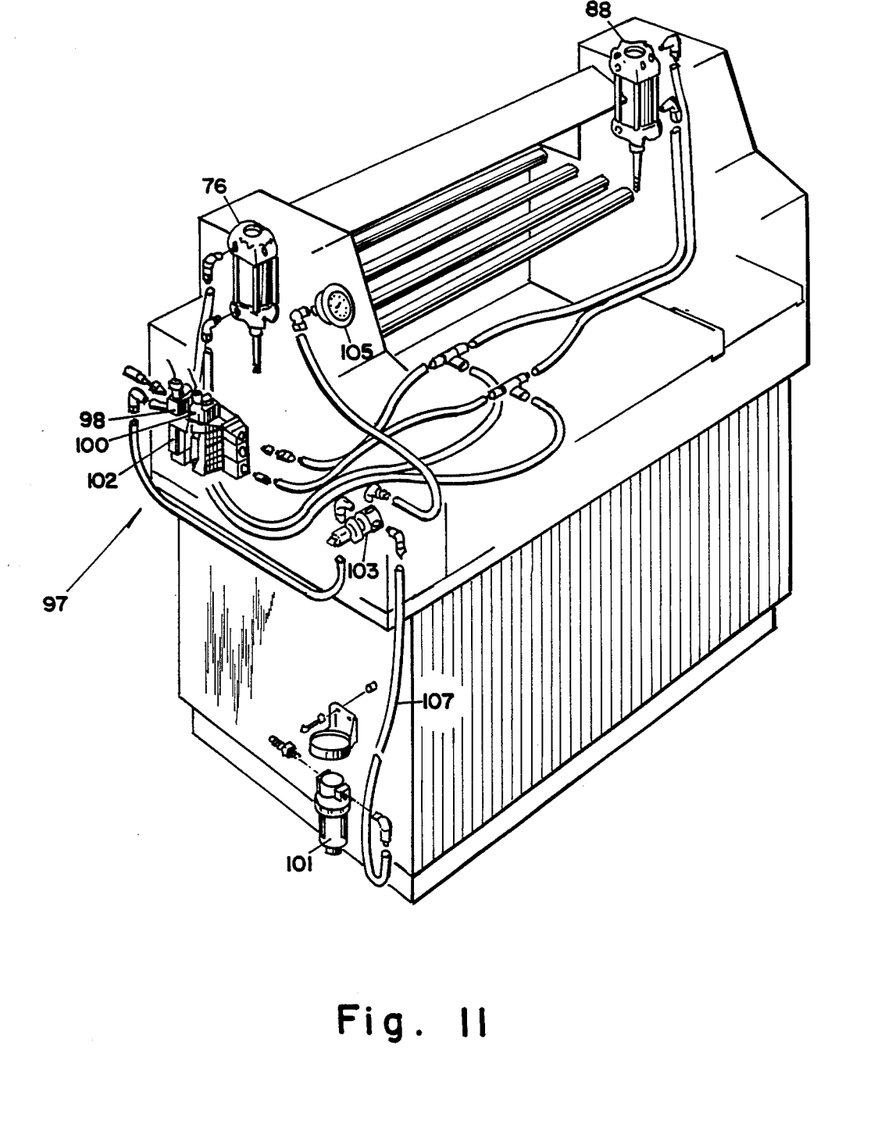
FIG. 11 is a perspective view showing the pneumatic system of the applicator.

Air pressure for actuating the upper roll 28 downwardly in order to effect a desired tacking operation is applied by a pneumatic system 97, as shown in FIG. 11, to the pneumatic cylinders 76 and 88 from a source of air under pressure under control of solenoid valves 98, 100, and 102, which are selectively actuated by electrical circuitry shown and described in connection with FIG. 10.

As shown in FIG. 11, the solenoid valves 98, 100 and 102 are incorporated in an electrovalve assembly 99 of the pneumatic system 97. The pneumatic system 97 further includes, in addition to the pneumatic cylinders 76 and 88, an air filter 101 having an input connection for the attachment thereto of a supply of air under suitable pressure, a pressure regulator 103, a pressure gauge 105, and a plurality of hose tubes 107 for the appropriate connection of the several components, as indicated and generally known to those skilled in the art and which need not further be described herein.

The selective energization of valves 98, 100 and 102 is controlled by electrical circuitry designated 104, as illustrated in FIG. 10. The circuitry 104 is connected by conductors 106 and 108 to a source of energizing alternating current, designated by supply lines $L_1$ and $L_2$, of commercial frequency and voltage. Connected between the supply lines $L_1$ and $L_2$ and the conductors 106 and 108 are a single pole-single throw switch 110, a stepdown transformer 112 and a thermomagnetic trip unit or circuit protection device 114. Desirably, the transformer 112 is so selected as to provide an electromotive force of 24 volts between conductors 106 and 108.

The circuitry 104 includes the previously mentioned sensing switch 116, and regulating means including a first timer 118 having a normally closed contact 120, a delay timer 122 having a normally closed contact 124, a delay latch relay 126 having normally open contacts 128 and 130, a first relay 132 having a normally closed contact 134 and a normally open contact 136, a photo eye or proximity switch 138, and a second relay 140 having a normally open contact 142. When energized, timers 118 and 122 are operative at the end of predetermined counts or periods to open the normally closed contacts 120 and 124, respectively, associated therewith.

The sensing switch 116 is provided to detect the entry of the leading edge of each printed circuit board 16 to be worked on into the tacking region 18, and more specifically, into tangential contact with the upper and lower rolls 28 and 30 resulting in upward movement of moveable roll 28. The photo eye or proximity switch 138 detects the trailing edge of each board 16. The position of switch 138 may be adjusted by means (not shown) to adjust the edge of the surface of the board 16 at which the second tack of the dry films 36 and 46 to the opposite surfaces of the board 16 is made.

Figure 6:
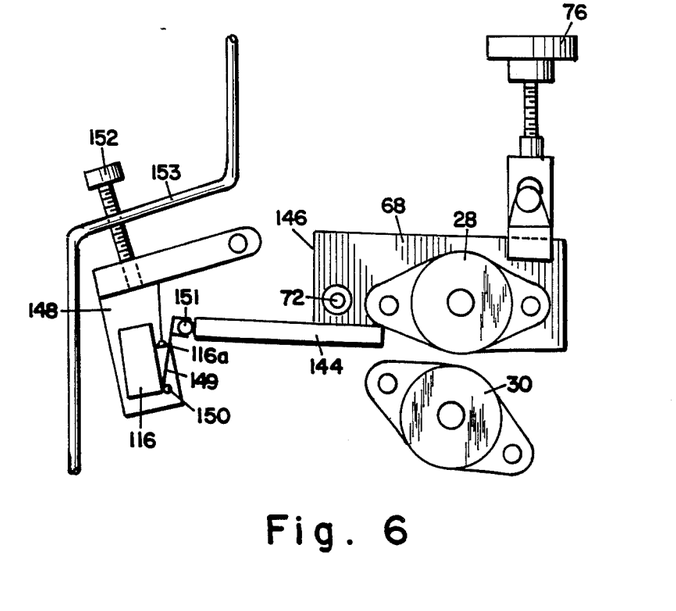
FIG. 6 is a fragmented view illustrating a switch actuator for sensing the entry of a printed circuit board into the tacking region with no board or panel positioned between the tacking rolls.
Figure 7:
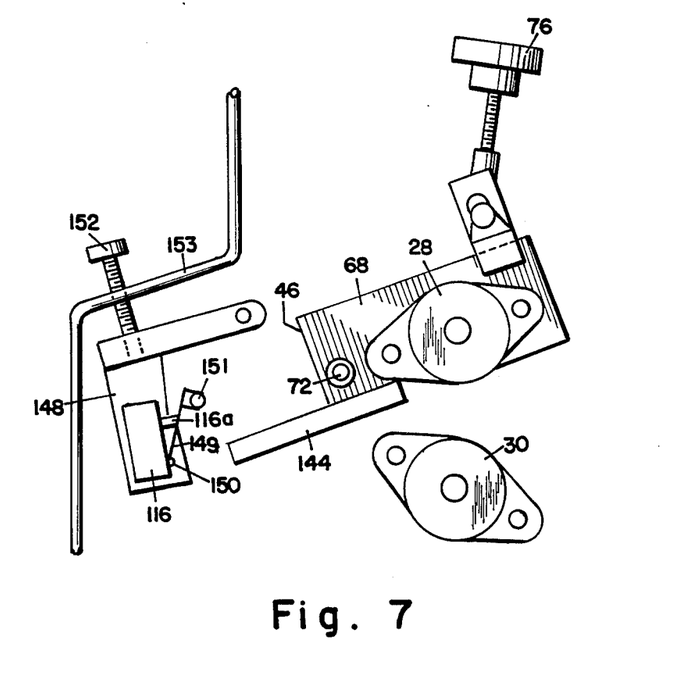
FIG. 7 is a fragmented view illustrating the position of the switch actuator of FIG. 6 with a printed circuit board positioned between the tacking rolls.

As shown in FIGS. 6 and 7, the sensing switch 116, which may comprise a normally open microswitch, has an actuating button 116a that is spring biased outwardly (by means not shown). Switch 116 is arranged for actuation by a bar 144 that is attached to the sliding plate 68, at the end 146 thereof adjacent the fixed pivot 72. The arrangement is such, with the sliding plate 68 being angularly deflectable about pivot 72, that the bar 144 is moved in a downward direction when the roll 28 is moved upwards, and vice versa. The switch 116 is vertically mounted on a depending leg of an L-shaped member 148. The end of the other leg of member 148 is pivoted to a frame member (not shown) of the applicator 10. A lever member 149 is pivoted at one end 150 on the switch 116 and extends along the length of the latter. A roller 151 attached to the other end of lever member 149 is in position to be engaged and pressed by the end of the bar 144 attached to sliding plate 68 when there is no board or panel 16 between the tacking rolls 28 and 30. To that end, an adjusting screw 152, which is mounted on a frame member 153 of the applicator 10, is attached in screw threaded relation with the L-shaped member 148. By adjustment of adjusting screw 152, the lever member 149 may be pressed to the extent required to keep the switch 116 in the open position thereof when the end of the bar 144 is in engagement with the roller 151. The adjusting screw 152 is adjusted to keep the switch 116 in such a position that it will snap from the open switch position shown in FIG. 6 into a closed switch position shown in FIG. 7 just before the upper roll 28 is lifted a distance corresponding to the height, that is, the thickness, of a printed circuit board entering the tacking region 18.

Figure 8:
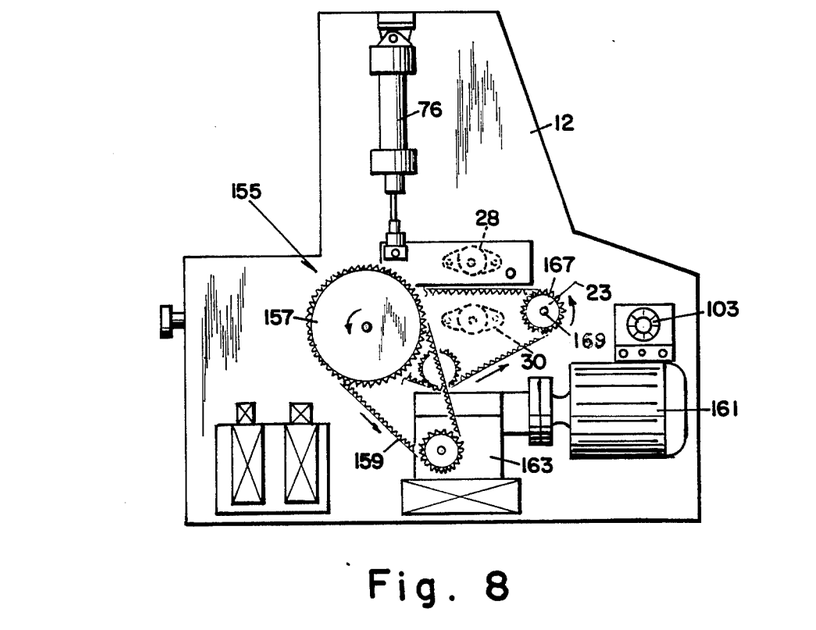
FIG. 8 is a view of the left side of the applicator 10 with the outer cover panel removed to show the circuit board input pinch roll and output pinch wheel chain drive mechanism including a main sprocket solidly attached to the lower output drive wheel shaft.

In FIG. 8 there is illustrated a view of the left side of the applicator 10 with the cover panel 12a removed. Removing the cover panel 12a shows that the drive mechanism for the input pinch rolls 22 and 23 and the output drive pinch wheels 24 and 25 comprises a chain drive mechanism 155 including a main sprocket 157 driven by a chain 159. The chain 159, in turn, is driven by an electrical motor 161 through suitable speed reducing mechanism 163.

Figure 9:
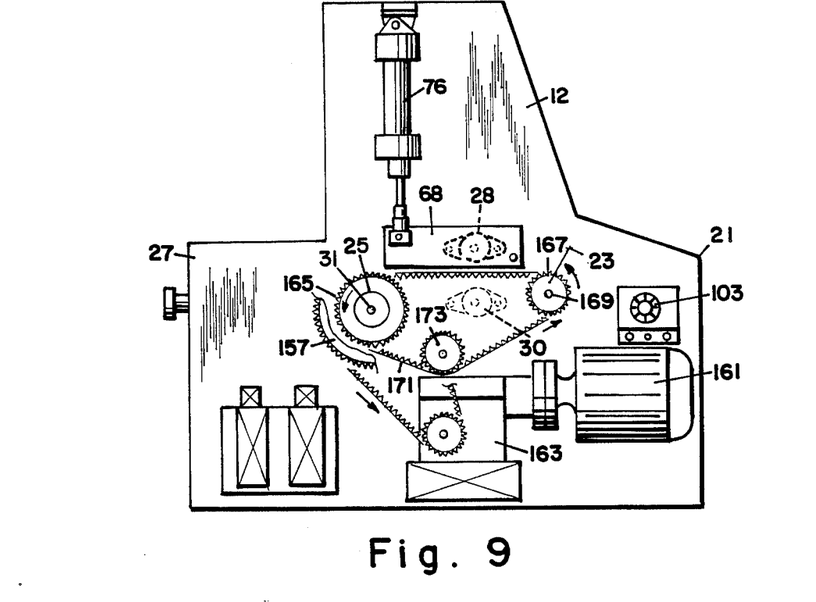
FIG. 9 is a view similar to FIG. 8 with the main sprocket sectioned to show the transmission of movement to the input pinch roll.

The illustration of FIG. 9 is similar to that of FIG. 8 except that the main sprocket 157 has been shown in fragmented form to reveal the transmission of movement from the main sprocket 157 to the lower input pinch roll 23. As shown, the main sprocket 157 is solidly attached to the shaft 31 of the lower output drive wheel 25. Also attached to the shaft 31 is an input feed drive sprocket 165. Sprocket 165, in turn, drives a sprocket 167 that is solidly attached to the shaft 169 for the lower input feed drive roll 23, such drive being by way of a chain 171 that passes over an intermediate idler sprocket 173.

In the idling position of the upper roll 28, the solenoid valve 98 is closed and no air pressure is applied to the pneumatic cylinders 76 and 88 to act on the upper roll 28. Solenoid valve 98 discharges air in the system through the vented port of solenoid valve 102.

When a printed circuit board 16 is introduced into the entrance side 21 of body 12, the input feed or pinch rolls 22 and 23 produce movement of the board 16 in the direction of movement from the entrance side 21 to the exit side 27 of the body 12. When the leading edge of the board 16 tangentially engages the tacking rolls 28 and 30, which rolls are able to rotate freely, the upper roll 28 opens and moves upward due to the vertical component of the tangential force of the edge of the board 16 on the roll 28. As a result, the end of bar 144 which actuates switch 116 is moved downward with the result that the switch 116 is adjusted from the open to the closed position thereof.

When switch 116 is moved to the closed position, as indicated in FIG. 10, relay 140 is energized, resulting in closure of contact 142 and the energization of solenoid 102. Actuation of solenoid 102 results in the introduction of air pressure into the system to solenoid valve 98 and results in operation of the pneumatic cylinders 76 and 88. This causes the upper roll 28 to be pressed or pushed downward against the lower roll 30 with the printed circuit board 16 and dry films 36 and 46 therebetween to produce the leading edge tack.

Simultaneously with the energization of relay 140, closure of switch 116 energizes timer 118. Timer 118 counts the tacking time. When a preset time has elapsed, timer 118 operates to open normally closed contact 120 to deenergize normally energized relay 132. This produces a reversal of the positions of relay contacts 134 and 136. This causes the deenergization of solenoid valve 98 and the energization of solenoid valve 100, resulting in relaxation of the downward pressure on tacking roll 28 and thereby release of the roll pressure tacking the leading end of films 36 and 46 to the printed circuit board 16. The reversal in position of relay contact 136, that is, closure thereof, results in energization of solenoid valve 100. This causes air to be supplied to the lower chambers of pneumatic cylinders 76 and 88 and allows the tacking roll 28 to rise and float under its own weight.

Upon the detection of the end of the board 16 in the tacking region 18, the proximity switch or photo eye 138 closes an energizing circuit to delay latch relay 126, which self retains through closure of a contact 128 thereof. Energization of relay 126 also closes contact 130 to close an energizing circuit to timer 122 thereby to control the beginning of the count thereof.

When timer 122 switches at the end of the count, contact 124 is opened to deenergize timer 118, which results in opening of contact 120 and deenergization of relay 132. This causes a new switch in the positions of the contacts 134 and 136 and consequently of solenoid valves 98 and 102, resulting in the supply of air to the upper chambers of pneumatic cylinders 76 and 88, and consequently, in the upper roll 28 being pressed down again by the pneumatic cylinders 76 and 88 to make the trailing edge tack.

When the printed circuit board 16 is moved beyond the tacking rolls 28 and 30 by means of the rear pinch wheels 24 and 25, the tacking roll 28 is moved down and the sensing switch 116 is actuated to the open position thereof, with the end of bar 144 in engagement with the roller 151 of lever member 149, thus deenergizing the electric circuitry 104 and resetting it.

Figure 12:
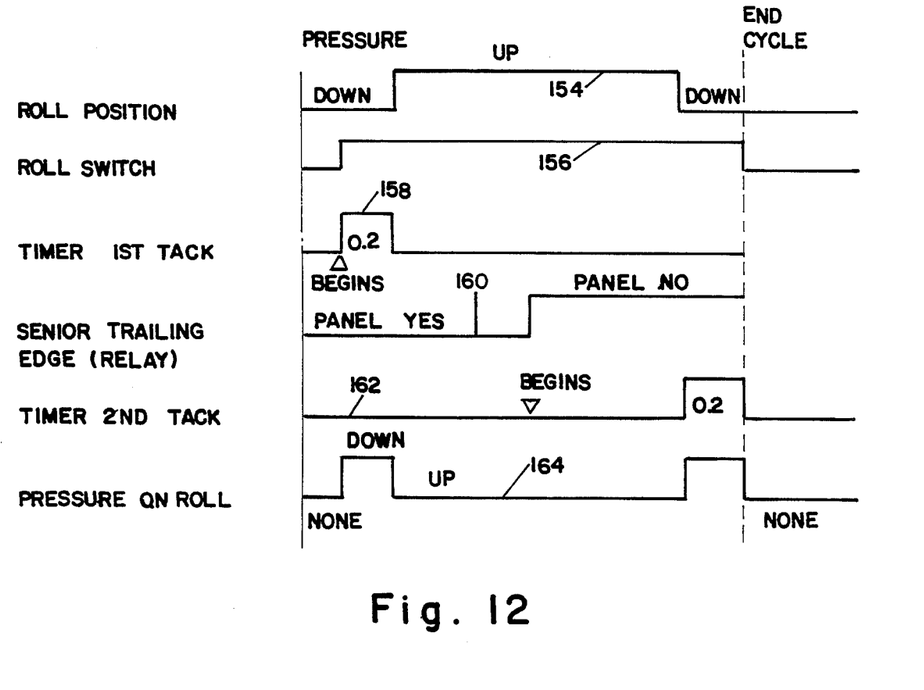
FIG. 12 is a timing chart or diagram illustrating the operation sequencing of the applicator.

The operation sequencing during a cycle of operation of the applicator 10, according to the invention, is illustrated in the timing diagram of FIG. 12. Specifically, curve 154 shows the position of the upper roll 28 as initially being down in the closed position, then raised for a major portion of the cycle, and down again as the end of the cycle approaches. Curve 156 shows the switch 116, which detects entry into the laminating region 18 of the board 16 to be worked, as initially being in the opened position thereof and then adjusted to the closed position, remaining in the latter position during the remainder of the cycle. Curve 158 shows the timing of the operation of the timer 118 in maintaining the tacking pressure on the roll 28 to effect the tacking of the films 36 and 46 to the leading edge surface of the board 16 for a period of 0.2 seconds, with the tacking beginning immediately upon operation of switch 116 to the "on" or closed position. Tacking for a longer period may be effected, for a period, as long as 0.5 seconds, for example, Curve 160 shows the action of the proximity switch or photo eye 138 in sensing the trailing edge of the board 16. The timing of the operation of the timer 124 in effecting the trailing edge tack to the board 16 is shown in curve 162. Curve 164 shows the pressure on the upper roll 28 during the cycle of operation, the position thereof initially being down with no applied pressure thereon, then down with pressure applied thereto to effect the tacking of the film 36 to the leading edge of the board, then up with pressure applied thereto and finally near the end of the cycle down with pressure applied thereto to effect the tacking at the trailing edge surface of the board.

Since the sheets of polymeric dry film 36 and 46 have high flow characteristics in the temperature range of 30° C. to 100° C., it is easier to tack them to the surfaces of printed circuit boards if applied at a temperature within this range.

For heating the tacking rolls 28 and 30 and controlling the temperature thereof to a suitable value within this range, there is provided, as shown in FIG. 10, heating resistors 166 and 168 which are arranged, in a manner known to those skilled in the art, in operative association with the upper roll 28 and the lower roll 30, respectively. Heating resistors 166 and 168 are energized from the alternating current supply lines $L_1$ and $L_2$ through a circuit including the circuit-breaker 110, an additional circuit breaker 170, a normally open relay operated switch 172, and a respectively associated control circuit 174 and 176, which control circuits may be identical.

Each of the control circuits 174 and 176 includes a temperature controller designated 178 and 180, respectively. Connected to the input of controller 178 is a thermocouple 182 which is operatively positioned adjacent to the external surface of the roll with the heating resistor 166 that is associated with the upper roll 28. A similar thermocouple 184, which is operatively positioned adjacent to the external surface of the roll with the heating resistor 168 that is associated with the lower roll 30, is connected to the input of controller 180.

Connected to and controlled by the output circuits of the controllers 178 and 180 are respectively associated power rectifiers 186 and 188. Rectifiers 186 and 188 are connected to the alternating current supply lines $L_1$ in series with a respectively associated heating resistor 166 and 168, with suitable brushes 190, 192 and 194, 196 being provided on the upper roll 28 and the lower roll 30, respectively, as shown.

Energization of the heating resistors 166 and 168, and hence, heating of the upper roll 28 and of the lower roll 30 is controlled responsively to continued energization of the electrical circuitry 104. That is to say, upon interruption of the energization of the circuitry 104 the energization of the heating resistors 166 and 168, and hence, the heating of the rolls 28 and 30 is discontinued. To that end a relay 202 with the coil connected in parallel to the circuitry 104 is arranged to open its contacts 172 in the energizing circuit to the control circuits 174 and 176 in the event of deenergization of circuitry 104 or by actuation of switch 206. Connected in parallel with relay 202 is a pilot light 204 to detect if the heating system is in "on" or "off" condition.

Thus, in accordance with the invention, there has been provided an apparatus for applying a dry film solder mask to the surface of a printed circuit board that allows handling of the board with the applied film and the removal of the polyester cover sheet, and further, allows complete elimination of air from the surfaces of the board to which the dry film has been loosely applied, being tacked thereto only, by the application of vacuum technology, heat and mechanical pressure, thus enabling complete encapsulation of the printed circuit board conductors and intimate contact of the solder mask film to the surfaces of the board.

The invention is characterized in the arrangement of the apparatus components which enable reduced calibration and human interaction. Key features include driven feed rollers 22 and 23 which automatically feed the board into the tacking rolls, the front tacking of the film by applying a force tangential to heated or unheated tacking rolls, and the logic used to regulate the leading and trailing edge tacking. After tacking the film to the leading edge of the board, the tacking rolls open to allow the film to be applied loosely and without pressure to the board. The rolls close again to tack the trailing edge.

With this description of the invention in detail, those skilled in the art will appreciate that modifications may be made to the invention without departing from the spirit thereof. Therefore, it is not intended that the scope of the invention be limited to the specific embodiment illustrated and described. Rather, it is intended that the scope of the invention be determined by the scope of the appended claims.

What is claimed is:

1. An applicator for applying a dry film solder mask on the surface of a board, said board having a leading edge surface and a trailing edge surface, comprising:

a dry film, said dry film having a first region at a leading portion thereof, a second region at a trailing portion thereof and a third region intermediate said first and second regions, each of said regions extending completely across the width of said dry film and the dimension of said third region between said first and second regions being substantially the same as that between the leading and trailing edge surfaces of said board, means for positioning said dry film relatively to said board such that said first region of said dry film initially is positioned adjacent said leading edge surface of said board and subsequently said second region is positioned adjacent said trailing edge surface of said board, and tacking means operative to tack said first and second regions of said dry film to the leading and trailing edge surfaces, respectively, of said board while allowing said third region of said dry film to be loosely applied to the surface of said board between said leading and trailing edges thereof, wherein said tacking means utilizes heat and pressure or pressure alone for tacking said first and second regions of said dry film to the leading and trailing edge surfaces of said board with said third region of said film being applied to said board without the utilization of heat or pressure, and wherein said tacking means includes first and second parallel tacking rolls, said rolls being positioned to form a tacking region therebetween and normally being disposed closely adjacent to each other in a closed position but being relatively movable to effect separation thereof to an open position, means for conveying said dry film into the tacking region between said tacking rolls, means for conveying said board with the leading edge surface thereof into the tacking region between said tacking rolls, engagement of the leading edge of said board with said tacking rolls being operative to produce a force tangential to said tacking rolls for effecting separation thereof to allow the leading edge surface of said board to be moved between said tacking rolls, first sensing means sensing such separation of said tacking rolls, and actuating means connected to and actuated by said first sensing means for producing a force tending to move said rolls toward the closed position thereof to press said dry film at said first region thereof against the leading edge surface of said board.

2. An applicator as defined by claim 1 wherein said first sensing means includes an electric switch, and
wherein said actuating means includes regulating means the operation of which is initiated by operation of said switch, and force producing means controlled by said regulating means.

3. An applicator as defined by claim 2 wherein said force producing means includes a pneumatic cylinder.

4. An applicator as defined by claim 2 wherein said regulating means includes timing means, said timing means being operative to maintain the operation of said force producing means for an interval of predetermined length for the application of tacking pressure at the leading edge surface of said board following which the operation of the force producing means is discontinued whereby said tacking rolls open to allow the film to be applied to said board without pressure, and
further including second sensing means operative to sense the approach of the trailing edge of said board, said second sensing means having a connection to said regulating means,
said regulating means being operative in response to sensing by said second sensing means of the approach of the trailing edge of said board to actuate said force producing means to apply pressure tending to effect closure of said rolls and thereby to apply tacking pressure to the trailing edge surface of said board.

5. An applicator as defined by claim 1 wherein said board is a printed circuit board and said dry film comprises a polyester cover sheet, a top coat on said polyester cover sheet, a layer of photoimageable composition on said top coat, and a protective cover sheet for said photoimageable composition, said photoimageable composition being curable after exposure and development to provide a hard, permanent, solder mask overlying said printed circuit board, said top coat being selectively adherent to said photoimageable composition relative to its adherence to said cover sheet, and further including
means to remove said protective cover sheet from said photoimageable composition, leaving said top coat and polyester cover sheet attached to said photoimageable composition, and
wherein said tacking means tacks, utilizing heat and pressure or pressure alone, said photoimageable composition with said top coat and polyester cover attached, in said first and second regions of said dry film to said leading and trailing edge surfaces, respectively, of said printed circuit board while applying said photoimageable composition, with said top coat and polyester cover attached, in said third region of said dry film without the application of heat and pressure.

6. An applicator as defined by claim 5 wherein said board has opposed surfaces each of which opposed surfaces has a leading edge surface and a trailing edge surface, and
said applicator comprises means for drawing said a dry film having a layer of photoimageable composition with said top coat and cover sheet attached around each of said tacking rolls onto the leading edge surface of a respectively associated one of the opposed surfaces of said board as said board is conveyed between said tacking rolls, said board being conveyed also between said layers of photoimageable composition,
whereby upon actuation of said actuating means by said first sensing means to produce a force tending to press said tacking rolls to the closed position thereof a layer of photoimageable composition is tacked simultaneously to the opposed surfaces of said board at each of the leading edge surfaces thereof.

7. An applicator as defined by claim 6 further including second sensing means to sense the approach of the trailing edge of said board,
said actuating means being connected to and responsive to the operation of said second sensing means to produce a force tending to press said tacking rolls to the closed position thereof thereby to simultaneously tack a layer of photoimageable composition to each of the opposed surfaces of said board at the trailing edge surfaces thereof.

8. An applicator as defined by claim 1 wherein said tacking rolls are spaced vertically with respect to each other with said first tacking roll being the upper roll and the second tacking roll the lower roll,
further including a movable bearing support means and a fixed bearing support means,
wherein said upper roll is mounted for rotation in said movable bearing support means and said lower roll is mounted for rotation in said fixed bearing support means,
said movable bearing support means including a plate at each end of said first tacking roll with a first end of each of said plates being pivoted for turning movement about a fixed pivot individual thereto, each of said plates having a second end for connection to a force acting in the vertical direction, and including a bearing at a position intermediate the first and second ends in which an individually associated end of said first tacking roll is supported for rotation.

9. An applicator as defined by claim 8 further including
a bar mounted on at least one of the plates of said bearing support means, said bar having an end portion comprising an extension of the first end of said one plate, and wherein said first sensing means comprises
switch means having a first switch position and a second switch position, said switch means being operatively associated with the end portion of said bar such that when a force is applied to and moves the second end of said plate upwardly, said switch means is actuated from said first switch position to said second switch position.

10. An applicator as defined by claim 9 further including adjustable means attached to said applicator and cooperating with said switch means to effect operation of said switch means upon a predetermined upward movement of the second end of said plate.

11. An applicator as defined by claim 9 wherein said applicator includes a frame member and said switch means comprises a microswitch having an actuating button, and further including
- a lever member having a first end and a second end, said lever member being pivoted at said first end on said switch means such that an intermediate portion thereof is adapted, when pressed toward said switch means, to engage, press and thereby cause said actuating button to assume a first switch position, said lever member having a roller means attached to the second end thereof,
- an L-shaped member having a first leg and a second leg with each of said legs having an end, the end of said first leg being pivoted to said frame member of said applicator with said L-shaped member so positioned that said second leg extends downwardly adjacent the end portion of said bar that comprises an extension of the end of said one plate,
- said switch means being mounted on said second leg of said L-shaped member such that said roller means attached to said lever member is engaged by the end portion of said bar when the second end of said plate is in a low position thereof thereby causing said spring member to press said acutating button, whereby upon upward movement of the second end of said plate the end portion of said bar slides off said roller means and is disengaged therefrom thus causing said lever member to relieve the pressure on the actuating button of said switch, thereby allowing said actuating button to assume a second switch position.

12. An applicator as defined by claim 10 wherein said applicator includes a frame member and said switch means comprises a microswitch the operating button of which extends toward the end portion of said bar, and said adjustable means comprises an adjustable screw mounted in said frame member of said applicator and positioned in cooperative relation with said switch acutating button whereby the operation of said switch means may be effected upon upward movement of said first tacking roll an amount barely sufficient to allow said board to be moved between said first and second tacking rolls.

13. An applicator as defined by claim 12 further including pneumatic cylinder means,
- a link between said pneumatic cylinder means and each of the second ends of said plates, and
- regulating means connected to said switch means, said regulating being operative to control said pneumatic cylinder means and being operated, in turn, in response to actuation of said switch means to said second switch position to actuate said pneumatic cylinder means to apply tacking pressure to the leading edge surface of the panel.

14. An applicator as defined by claim 13 wherein said regulating means includes timing means, said timing means being operative to maintain the actuation of the pneumatic cylinder means for a predetermined interval for the application of tacking pressure to the leading edge surface of the panel following which the actuation of the pneumatic cylinder means to apply tacking pressure is discontinued whereby the tacking rolls open to allow the film of photoimageable composition to be applied to said board without pressure.

15. An applicator as defined by claim 14 further including second sensing means, said second sensing means being operative to sense the approach of the trailing edge surface of said panel and being connected to said regulating means,
- said regulating means being operative in response to sensing of the approach of the trailing edge surface of said panel by said second sensing means to actuate said pneumatic cylinder means to close said tacking rolls to apply tacking pressure to the trailing edge surface of the panel, and
- second timing means connected to said regulating means and operative to maintain the tacking pressure at the trailing edge surface of said panel for a predetermined interval.

16. An apparatus as defined by claim 1 wherein said means for conveying said board with the tacking edge surface thereof into the tacking region between said tacking rolls comprises pinch feed rollers which engage the opposite surfaces of the board with one at least of said feed rollers being driven.

17. An applicator as defined by claim 9 wherein said actuating means includes regulating means the operation of which is initiated by the operation of said switch means of said first sensing means responsively to the separation of said tacking rolls by the engagement therewith of the leading edge of the board,
- wherein said switch means is a first electric switch that is in an open circuit position when in said first position and is in a closed circuit position when in said second switch position,
- said actuating means further including force producing means controlled by said regulating means,
- said regulating means comprising an electrical circuit including said first electric switch, said electrical circuit further including
- a first timer having a normally closed contact,
- a delay timer having a normally closed contact,
- a delay latch relay having first and second normally open contacts,
- a first relay having a normally closed first contact and a normally open second contact,
- a second sensing means comprising a second electric switch operative to sense the trailing edge of the board as the board is being conveyed through said tacking region,
- a second relay having a normally open contact,
- a first control valve which when energized is operative to cause the delivery of power to the force producing means,
- a second control valve which when energized is operative to direct the power of the force producing means in a direction to press at least one of the tacking rolls against the board, and
- a third control valve which when energized is operative to reverse the direction of the power of the force producing means thereby to cause separation of the tacking rolls,
- the energizing circuit connections to the first timer, the delay relay, the delay timer, and the second relay including the first electric switch,
- the normally closed contact of said delay timer being included in the energizing circuit connection to the first timer,
- the normally closed contact of the first timer being included in an energizing circuit connection to the first relay, the normally open contact of the second relay being included in an energizing circuit connection to first control valve, one of the normally open contacts of said delay latch relay being included in a self-retaining energizing circuit connection to the delay latch relay and the other normally open contact being connected in the energizing circuit connection to the delay timer, the normally closed contact of the first relay being connected in an energizing circuit connection to the second control valve with the normally open contact thereof being connected in an energizing circuit with the third control valve, whereby upon actuation of said first electric switch to the closed position thereof responsively to the engagement of the board with the tacking rolls, the second relay is energized to effect closing of the normally closed contact thereof and thereby the energization of the first control valve to cause the delivery of power to the force producing means, which power is directed by the second control valve to cause the pressing of at least one of the tacking rolls to tack the film to the board, the normally closed first contact of the first relay being then in a closed position in the energizing circuit to the second control valve, said first timer being simultaneously energized to count the tacking time and changing the position of the normally closed contact thereof to an open position when a predetermined time has elapsed, resulting in deenergization of the first relay and reversal of the positions of the said first and second contacts of the first relay, thereby causing the deenergization of the second control valve and the energization of the third control valve, resulting in a reversal of the direction of power by the force producing means and thus the movement of the said at least one tacking roll away from the board, detection of the end of the board by the second electric switch changing the position of the first and second contacts of the delay latch relay thereby to close an energizing circuit to the delay timer and effecting the beginning of the count for the delay timer, the delay timer when energized opening the normally closed contact thereof to deenergize the first timer and as a result energization of the first relay, causing a switch in the positions of the first and second contacts of the first relay, resulting in energization of the second control valve and operation of the force producing means to press the at least one tacking roll against the film and board to make the trailing edge surface tack, the first electric switch reverting to the open position thereof when the board leaves the tacking rolls, thus deenergizing the regulating means and the force producing means and resetting the electrical circuit.

18. An applicator as defined by claim 19 wherein said force producing means comprises a pneumatic system including first and second pneumatic cylinder means connected to the second end of a respective one of the plates of said bearing support means, each of said pneumatic cylinder means including opposed chambers, wherein the first control valve is connected to control the supply of air pressure to the pneumatic system, wherein the first, second and third control valves are solenoid valves, energization of the second solenoid valve resulting in the connection of air pressure to one of the opposed chambers of each of the pneumatic cylinders, said one chamber causing movement of the associated second end of said plates to press said at least one tacking roll against the film and the board, and energization of the third solenoid resulting in the connection of air pressure to the other one of the opposed chambers of each of the pneumatic cylinders to cause separation of said at least one tacking roll from the board.

19. A method for applying a dry film solder mask on the surface of a board, said board having a leading edge surface and a trailing edge surface, said dry film having a first region at a leading portion thereof, a second region at a trailing portion thereof and a third region intermediate said first and second regions, with each of said regions extending completely across the width of said dry film and the dimension of said third region between said first and second regions being substantially the same as that between the leading and trailing edge surfaces of said board, comprising the steps of:

positioning said dry film relatively to said board such that said first region of said dry film initially is positioned adjacent said leading edge surface of said board and subsequently said second region of said dry film is positioned adjacent said trailing edge surface of said board, and tacking said first and second regions of said dry film to the leading and trailing edge surfaces, respectively, of said board such that said dry film is applied to the surface of the board as an integrated whole while allowing said third region of said dry film to be loosely applied to the surface of the board between said leading and trailing edge surfaces thereof.

* * * * *